United States Patent
Jin

(10) Patent No.: US 9,438,170 B2
(45) Date of Patent: Sep. 6, 2016

(54) POWER AMPLIFIER

(71) Applicant: Taiwan Semiconductor Manufacturing Company, Ltd., Hsin-Chu (TW)

(72) Inventor: Jun-De Jin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/486,672

(22) Filed: Sep. 15, 2014

(65) Prior Publication Data

US 2016/0079923 A1    Mar. 17, 2016

(51) Int. Cl.
*H03F 3/45* (2006.01)
*H03F 3/21* (2006.01)
*H03F 3/04* (2006.01)
*H03F 1/02* (2006.01)
*H03F 3/19* (2006.01)

(52) U.S. Cl.
CPC ............. *H03F 1/0205* (2013.01); *H03F 3/19* (2013.01); *H03F 3/21* (2013.01); *H03F 3/45269* (2013.01); *H03F 2200/451* (2013.01); *H03F 2203/45156* (2013.01)

(58) Field of Classification Search
USPC .......................... 330/310–311, 252–261, 277
See application file for complete search history.

(56) References Cited

U.S. PATENT DOCUMENTS

| | | | |
|---|---|---|---|
| 7,511,578 B2 | 3/2009 | Dupuis et al. | |
| 7,768,350 B2 | 8/2010 | Srinivasan et al. | |
| 7,786,807 B1* | 8/2010 | Li | H03F 1/0244 330/290 |
| 7,821,339 B1* | 10/2010 | Afsahi | H03F 1/0277 330/253 |
| 8,427,241 B2* | 4/2013 | Ezzeddine | H03F 1/0205 330/310 |
| 8,686,796 B2* | 4/2014 | Presti | H03F 1/223 330/302 |
| 8,847,689 B2* | 9/2014 | Zhao | H03F 1/0283 330/277 |
| 2014/0354358 A1* | 12/2014 | Kim | H03F 3/211 330/253 |

OTHER PUBLICATIONS

Aoki, Ichiro et al., "A Fully-Integrated Quad-Band GSM/GPRS CMOS Power Amplifier," IEEE Journal of Solid-State Circuits, vol. 43, Issue 12, Dec. 2008, pp. 2747-2758.

* cited by examiner

*Primary Examiner* — Hieu Nguyen
(74) *Attorney, Agent, or Firm* — Slater Matsil, LLP

(57) ABSTRACT

A power amplifier includes an input circuit configured to receive an input signal. At least two transistors connected in series. A first transistor of the at least two transistors is located at a first end of the at least two transistors. A second transistor of the at least two transistors is located at a second end of the at least two transistors. The first transistor is coupled to a low voltage power supply node. The first gate of the first transistor is coupled to a first bias voltage. The input signal is coupled to a first gate of the first transistor. At least one capacitor is coupled between a second gate of the second transistor and the low voltage power supply node. An output circuit coupled to a second gate of the second transistor.

21 Claims, 8 Drawing Sheets

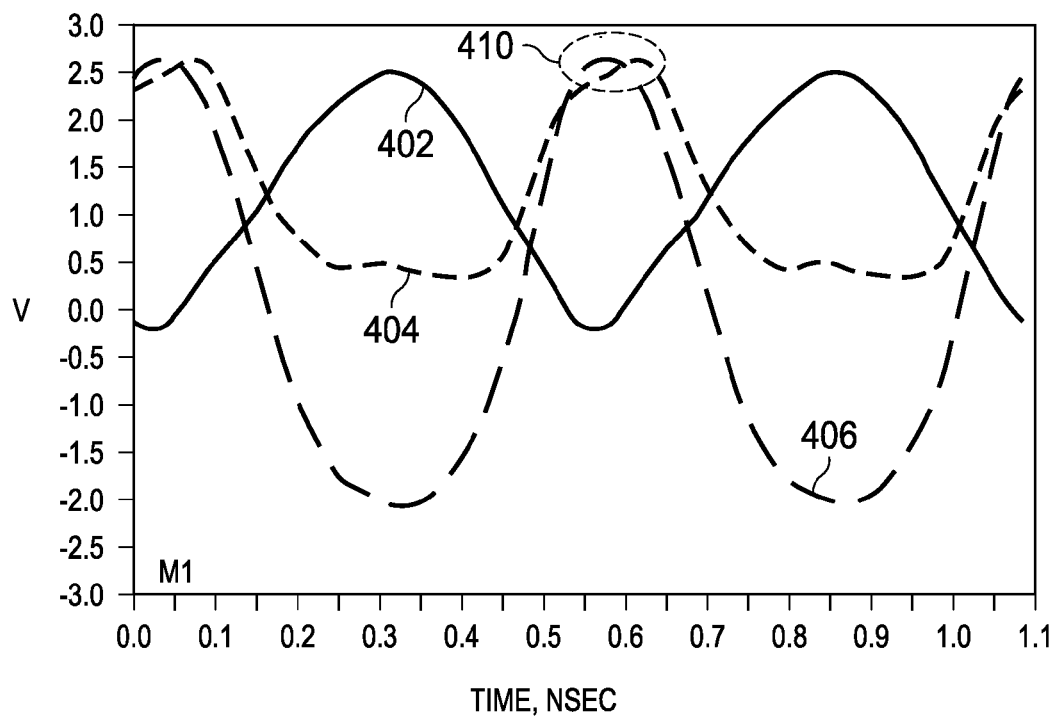
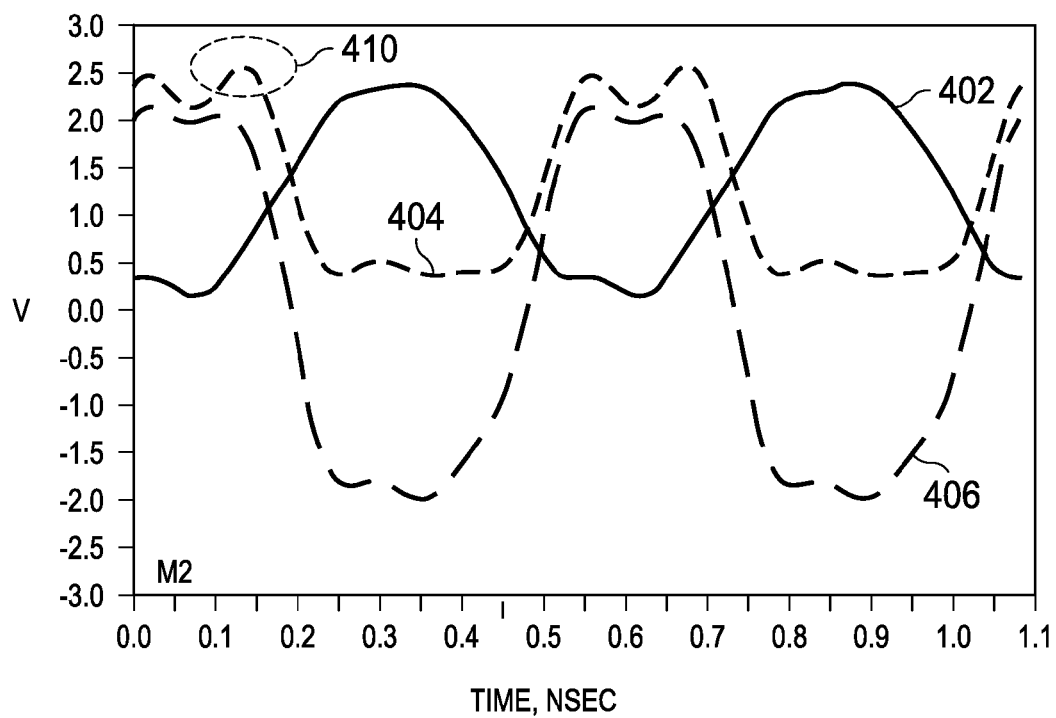

POWER AMPLIFIER

BACKGROUND

A radio-frequency (RF) power amplifier is a type of electronic amplifier used to convert a low-power radio-frequency signal into a larger signal of higher power, typically for driving the antenna of a transmitter. Some performance criteria for the power amplifier include high efficiency, high output Power (PldB) compression, good return loss on the input and output, good gain, and good heat dissipation characteristics.

The basic applications of the RF power amplifier include driving to another high power source, driving a transmitting antenna, and exciting microwave cavity resonators. Among these applications, driving transmitter antennas is a widely used application. Some power amplifiers in transmitter-receivers are used for voice and data communication in various applications.

Power amplifiers are also commonly used in wireless devices to amplify a signal for transmission. Power amplifiers may include a final gain stage, referred to as an output gain stage, to amplify the signal to a desired power level for its output to a load such as an antenna that radiates the amplified signal. A power amplifier having a good performance under a relatively low power supply voltage is desired in some applications such as wireless devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D illustrate operation voltage swings of transistors in the power amplifier of FIG. 1 according to some embodiments.

DETAILED DESCRIPTION

Figure 1:
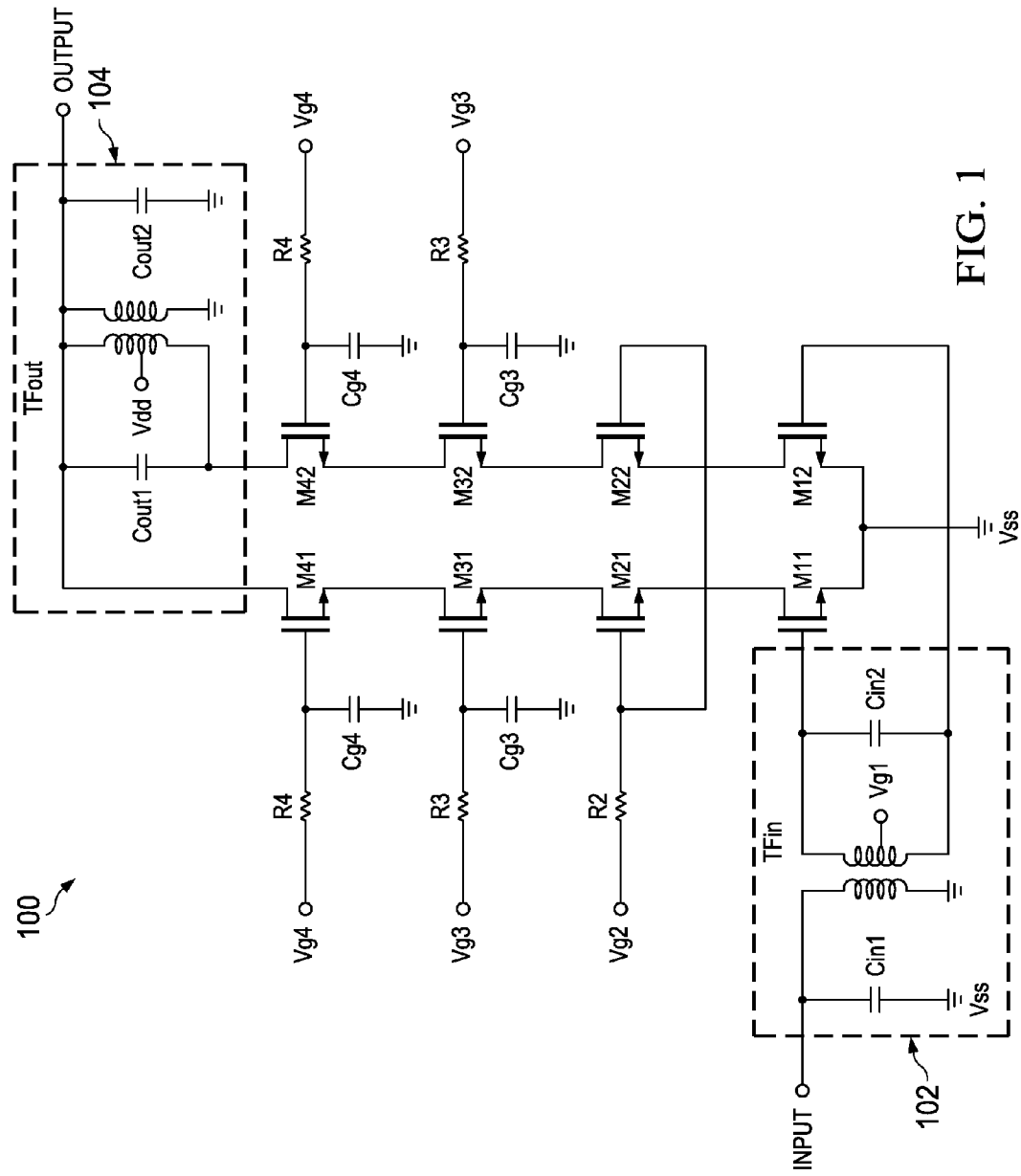
FIG. 1 illustrates a power amplifier according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some power amplifiers utilize bipolar transistors in fabrication processes such as a gallium arsenide (GaAs) process which offers high gain devices (e.g., bipolar transistors). However, other power amplifiers are implemented using a complementary metal oxide semiconductor (CMOS) process. In such systems, the power amplifier includes metal-oxide-semiconductor field-effect transistor (MOSFET) devices, such as NMOS and PMOS transistors.

For power amplifiers using MOSFET devices, the operation voltage is relatively low compared to bipolar transistors. Therefore, keeping the operation voltages of the MOSFET devices within a specified range to reduce stress of the devices and at the same time boosting output power by providing sufficient output signal voltage swing is a challenging issue in designing the power amplifiers.

For example, a GaAs hetero-junction bipolar transistor with a collector node bias voltage of 3.7 V may have an output voltage swing of up to 7.4 V. This will not cause a reliability issue for the hetero-junction bipolar transistor. However, if the same 7.4 V output voltage swing is provided at the drain of a MOSFET device, there can be a reliability issue from over stressing the device. For MOSFET devices having a lower operation voltage, a different design is necessary for the power amplifier.

FIG. 1 illustrates a power amplifier 100 according to some embodiments. The power amplifier 100 includes an input circuit 102, and four transistor pairs M11-M12, M21-M22, M31-M32, and M41-M42, and an output circuit 104.

The input circuit 102 is configured to receive an input signal at the input node. In this example, the power amplifier 100 is arranged to receive an input signal at the input node and the input circuit 102 provides differential signals to the transistor pair of M11-M12 from the input signal. A capacitor Cin1 is coupled between the input node and a low voltage power supply node (Vss or ground). The capacitor Cin1 can be used to provide input impedance matching. For example, the input impedance can be designed to be 50 ohm. In some embodiments, the capacitor Cin1 has a capacitance value ranging from about 1 fF to about 100 pF. In one example, the capacitor Cin1 has a capacitance value of 0.46 pF.

One side of a transformer TFin is also coupled between the input node and a low voltage power supply node (Vss or ground) in parallel with the capacitor Cin1. The other side of the transformer TFin is coupled in parallel with another capacitor Cin2. The capacitor Cin2 is coupled in between the gates of the transistor pair M11-M12. In some embodiments, the transformer TFin has an inductance value ranging from about 1 pH to about 100 nH and a coupling coefficient of 0.01 to 1. In some embodiments, the capacitor Cin2 has a capacitance value ranging from about 1 fF to about 100 pF. In one example, the capacitor Cin2 has a capacitance value of 0.74 pF.

The transformer TFin and the capacitor Cin2 provides differential signals to the gates of the transistor pair M11-M12. A bias voltage Vg1 is coupled to the gate of the transistor pair M11-M12. In one example, Vg1 is 1.25 V with the drain-source voltage Vds of transistors of the transistor pairs M11-M12, M21-M22, M31-M32, and M41-M42 specified at 2.5 V. In one example, the gate-source voltage Vgs of transistors of the transistor pairs M11-M12, M21-M22, M31-M32, and M41-M42 is also specified at 2.5 V. In some embodiments, Vg1 is 0.5 times of the specified drain-source voltage Vds of transistors of the transistor pairs.

The four transistor pairs M11-M12, M21-M22, M31-M32, and M41-M42 are NMOS transistors in some embodiments. The four transistor pairs M11-M12, M21-M22, M31-M32, and M41-M42 are connected in series. For example, the drains of the transistor pair M11-M12 is connected to the sources of the transistor pair M21-M22 respectively. The drains of the transistor pair M21-M22 is connected to the sources of the transistor pair M31-M32 respectively. The drains of the transistor pair M31-M32 is connected to the sources of the transistor pair M41-M42 respectively.

The transistor pair M11-M12 is at the bottom end of the four transistor pairs. The transistor pair M41-M42 is at the top end of the four transistor pairs. The transistor pair M11-M12 is coupled to the low voltage power supply node (Vss or ground). In some embodiments, the gates of the transistor pair M21-M22 are tied (connected) together. A resistor R2 is coupled to the gates of the transistor pair M21-M22 and a gate bias voltage Vg2. The resistor R2 has a relatively large resistance value in some embodiments and blocks alternative current (AC) component to the bias voltage Vg2. In some embodiments, the resistor R2 has a resistance value ranging from about 100 ohm to about 100 Gohm. In one example, R2 has a resistance value of 10 kohm or 50 kohm. In one example, Vg2 is 2.5 V with the drain-source voltage Vds of transistors of the transistor pairs M11-M12, M21-M22, M31-M32, and M41-M42 specified at 2.5 V. In some embodiments, Vg2 is equal to the specified drain-source voltage Vds of transistors of the transistor pairs.

Figure 4A:
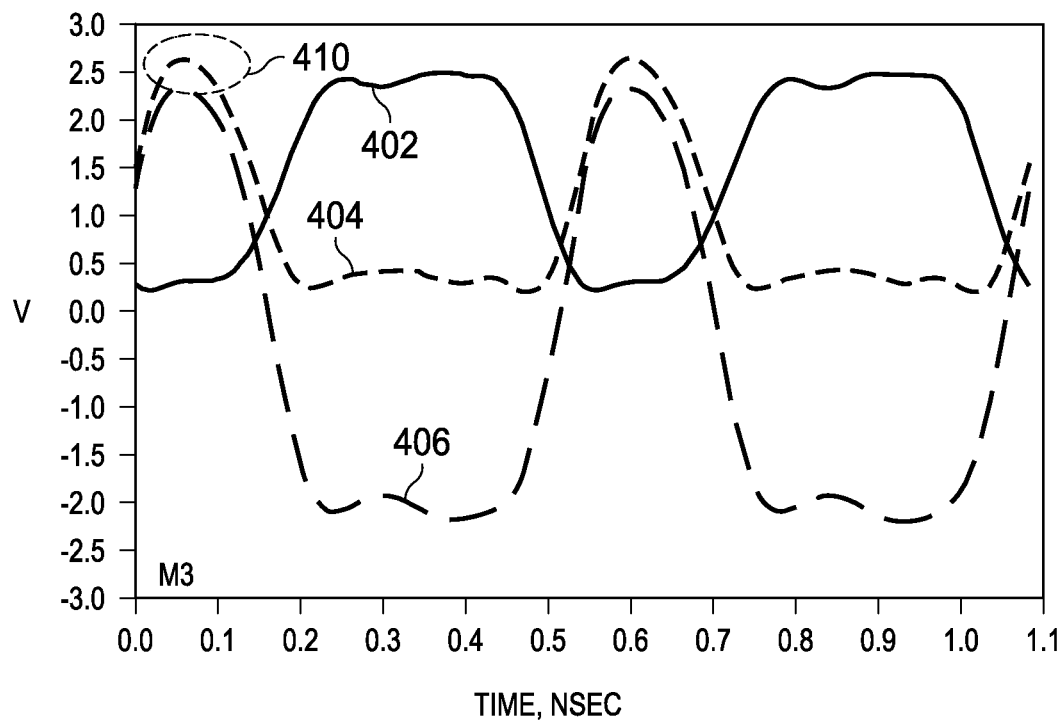

A capacitor pair Cg3 is coupled between the respective gates of the transistor pair M31-M32 and the low voltage power supply node (Vss or ground). The gate capacitor pair C0 helps to reduce stress of the transistor pair M31-M32 by shaping (lowering) the gate operation voltage across the device as shown in FIG. 4A and described below. In some embodiments, the capacitor Cg3 has a capacitance value ranging from about 1 ff to about 100 pF. In one example, the capacitor Cg3 has a capacitance value of 10 pF. A resistor pair R3 is coupled to the respective gates of the transistor pair M31-M32 and a gate bias voltage Vg3. The resistor pair R3 has a relatively large resistance value in some embodiments and blocks alternative current (AC) component to the bias voltage Vg3. In some embodiments, the resistor pair R3 has a resistance value ranging from about 100 ohm to about 100 Gohm. In one example, R3 has a resistance value of 10 kohm or 50 kohm. In one example. Vg3 is 3.75 V with the drain-source voltage Vds of transistors of the transistor pairs M11-M12, M21-M22, M31-M32, and M41-M42 specified at 2.5 V. In some embodiments, Vg3 is 1.5 times of the specified drain-source voltage Vds of transistors of the transistor pairs.

Figure 4B:
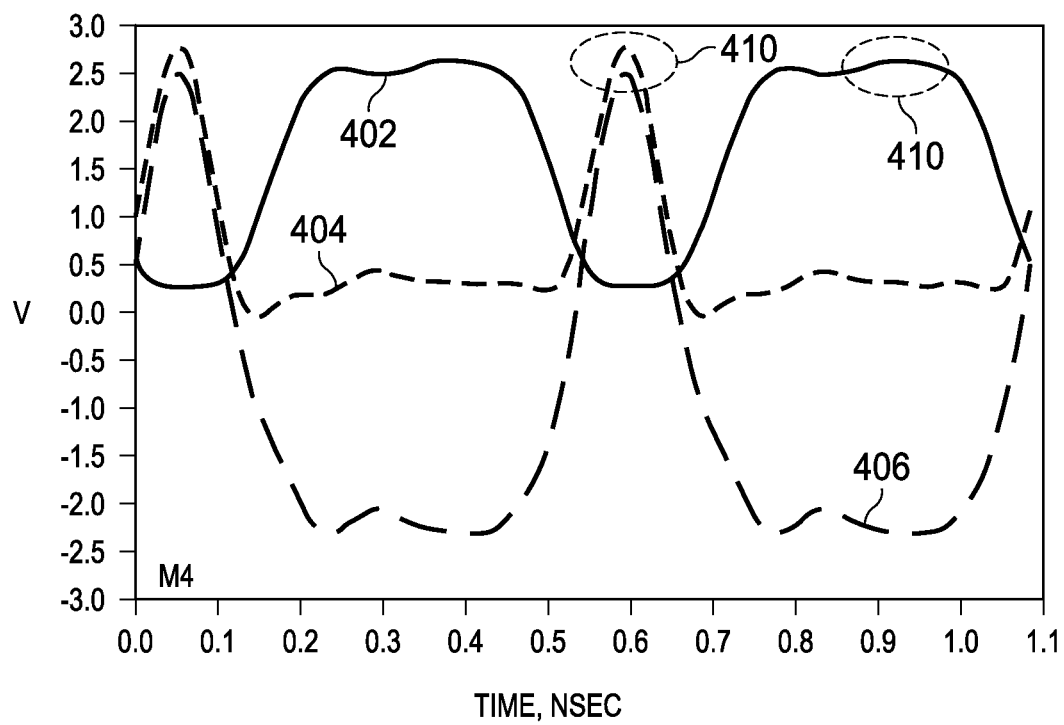

A capacitor pair Cg4 is coupled between the respective gates of the transistor pair M41-M42 and the low voltage power supply node (Vss or ground). The gate capacitor pair Cg4 helps to reduce stress of the transistor pair M41-M42 by shaping (lowering) the gate operation voltage across the device as shown in FIG. 4B and described below. In some embodiments, the capacitor Cg4 has a capacitance value ranging from about 1 fF to about 100 pF. In one example, the capacitor Cg4 has a capacitance value of 5 pF. A resistor pair R4 is coupled to the respective gates of the transistor pair M41-M42 and a gate bias voltage Vg4. The resistor pair R4 has a relatively large resistance value in some embodiments and blocks alternative current (AC) component to the bias voltage Vg4. In some embodiments, the resistor pair R4 has a resistance value ranging from about 100 ohm to about 100 Gohm. In one example, R4 has a resistance value of 10 kohm or 50 kohm. In one example, Vg4 is 5 V with the drain-source voltage Vds of transistors of the transistor pairs M11-M12, M21-M22, M31-M32, and M41-M42 specified at 2.5 V. In some embodiments, Vg4 is two times of the specified drain-source voltage Vds of transistors of the transistor pairs.

The output circuit 104 is coupled to the top end transistor pair M41-M42 and provides an output signal at the output node. The output circuit 104 provides the output signal from the differential signals at the drains of the transistor pair of M41-M42. A capacitor Cout2 is coupled between the output node and a low voltage power supply node (Vss or ground). The capacitor Cout2 can be used to provide output impedance matching. For example, the output impedance can be designed to be 50 ohm for an antenna. In some embodiments, the capacitor Cout2 has a capacitance value ranging from about 1 ff to about 100 pF. In one example, the capacitor Cout2 has a capacitance value of 1.45 pF.

One side of a transformer TFout is coupled between the output node and a low voltage power supply node (Vss or ground) in parallel with the capacitor Cout2. The other side of the transformer TFout is coupled in parallel with another capacitor Cout1. In some embodiments, the transformer TFout has an inductance value ranging from about 1 pH to about 100 nH and a coupling coefficient of 0.01 to 1. In some embodiments, the capacitor Cout1 has a capacitance value ranging from about 1 fF to about 100 pF. In one example, the capacitor Cout1 has a capacitance value of 4.15 pF.

The transformer TFout and the capacitor Cout1 provides the output signal from differential signals at the drains of the transistor pair M41-M42. A high voltage power supply Vdd is coupled to the drains of the transistor pair M41-M42. In some embodiments, Vdd ranges from about 3 V to about 4 V. In one example, Vdd is 3.7 V.

In one example, the power amplifier 100 is operated with the drain-source voltage Vds and the gate-source voltage Vgs of transistors of the transistor pairs M11-M12, M21-M22, M31-M32, and M41-M42 specified at 2.5 V. Assuming the voltage swing of the input signal coupled to the gates of the transistor pair M11-M12 is 0 V-2.5 V, the voltage swing at the drains of the transistor pair M11-M12 is 0 V-2.5 V in one example. At the gates of the transistor pair M21-M22, there is no signal swing because of the differential operation with the gates of the transistor pair M21-M22 tied together. The voltage swing at the drains of the transistor pair M21-M22 is 0 V-5 V after two transistor pair stacking in series with M11-M12 and M21-M22 in one example.

The voltage swing at the gates of the transistor pair M31-M32 is 2.5 V-5 V in one example, compared to 0 V-6.25 V if the capacitor pair Cg3 is not coupled to the gates of the transistor pair M31-M32. The voltage swing at the drains of the transistor pair M31-M32 is 0 V-7.5 V after three transistor pair stacking in series with M11-M12, M21-M22, and M31-M32 in one example. The voltage swing at the gates of the transistor pair M41-M42 is 2.5 V-7.5 V in one example, compared to 0 V-8.75 V if the capacitor pair Cg4 is not coupled to the gates of the transistor pair M41-M22. The voltage swing at the drains of the transistor pair M41-M42 is 0 V-10 V after four transistor pair stacking in series with M11-M12, M21-M22, M31-M32, and M41-M42 in one example.

By coupling gate capacitors Cg3 and Cg4 to the gates of the transistor pairs M31-M32 and M41-M42, the operation voltage range across each transistor is reduced to about the specified voltage (e.g., +/−2.5 V) as described below with respect to FIGS. 4A-4D. Thus, the stress of each transistor is reduced and the power amplifier 100 does not have the reliability issue from over stressing the transistors.

Figure 6:
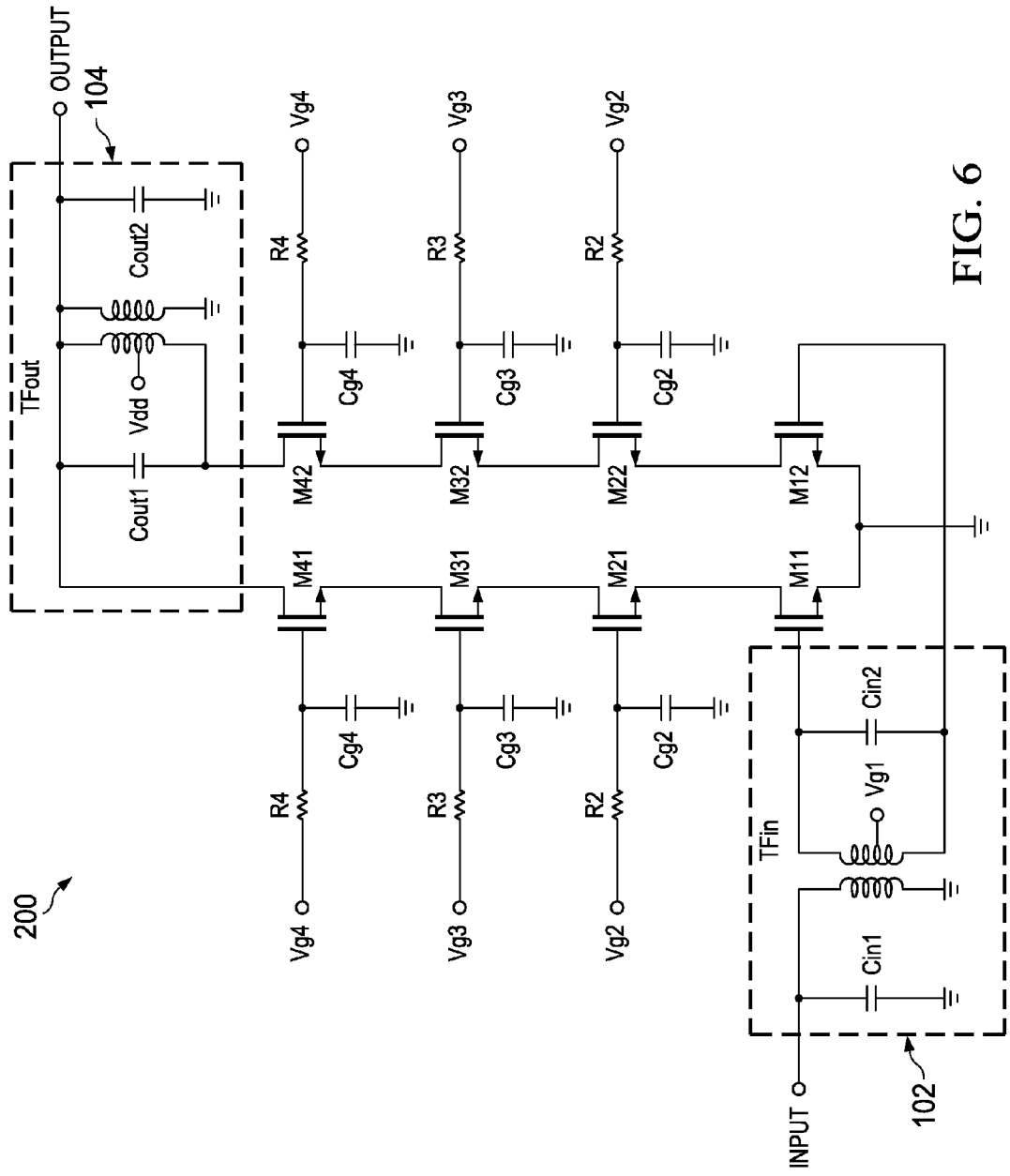
FIG. 6 illustrates another embodiment of a power amplifier according to some embodiments.

Even though four transistor pairs M11-M12, M21-M22, M31-M32, and M41-M42 are stacked in series to boost the output signal swing, the stacked number of transistor pairs is not limited to four. For example, two, three, five, or more transistor pairs can be stacked in series while using gate capacitors to reduce voltage swing across each transistor. Also, even though two gate capacitor pairs Cg3 and Cg4 are used to reduce voltage swing across transistors (thus the stress on the device) in this example, an additional capacitor pair can be used as shown in FIG. 6 and described below. The values of each component, including gate capacitors Cg3 and Cg4 can be determined from simulation in some embodiments.

Figure 2:
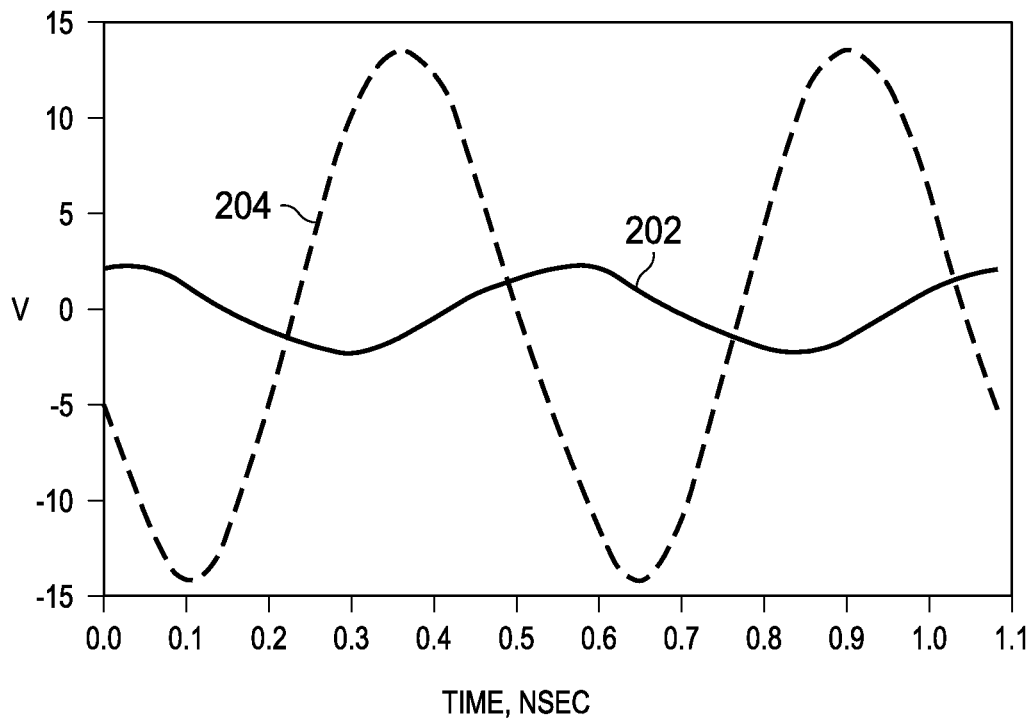
FIG. 2 illustrates input/output signal waveforms of the power amplifier of FIG. 1 according to some embodiments.

FIG. 2 illustrates input/output signal waveforms of the power amplifier 100 of FIG. 1 according to some embodiments. In this example, the input signal waveform 202 shows a voltage swing of about +/−2.5 V and the output signal waveform 204 shows a voltage swing of about +/−14 V. The output power was 32.7 dBm and the power-added efficiency was 40%. The operating frequency of the radio frequency signal was 1.85 GHz. The power-added efficiency (PAE) is a metric for rating the efficiency of a power amplifier that takes into account the effect of the gain of the amplifier. It is calculated as:

$$PAE=100*\{[P_{OUT}]_{RF}-[P_{IN}]_{RF}\}/[P_{DC}]_{TOTAL},$$

where $[P_{OUT}]_{RF}$ is the output RF signal power, $[P_{IN}]_{RF}$ is the input RF signal power, and $[P_{DC}]_{TOTAL}$ is the total direct-current (DC) power.

Figure 3:
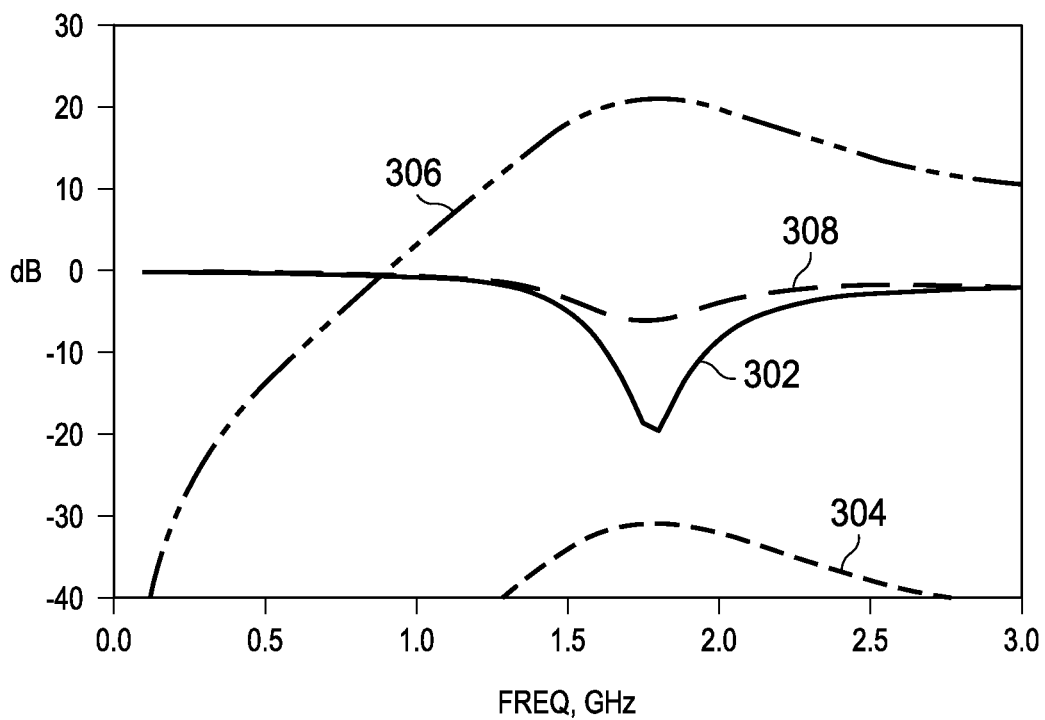
FIG. 3 illustrates S-parameter plots of the power amplifier of FIG. 1 according to some embodiments.

FIG. 3 illustrates S-parameter plots of the power amplifier of FIG. 1 according to some embodiments. S11 plot 302 is the input port voltage reflection coefficient, and has a value of about −16 dB at the operation frequency of about 1.85 GHz. S12 plot 304 is the reverse voltage gain, and has a value of about −31 dB at the operation frequency of about 1.85 GHz. S21 plot 306 is the forward voltage gain, and has a value of about 21 dB at the operation frequency of about 1.85 GHz. S22 plot 308 is the output port voltage reflection coefficient, and has a value of about −5 dB at the operation frequency of about 1.85 GHz.

FIGS. 4A-4D illustrate voltage swings of transistors in the power amplifier of FIG. 1 according to some embodiments. FIG. 4A shows voltage swings Vgs, Vds, and Vdg of the transistor pair M31-M32, FIG. 4B shows voltage swings Vgs, Vds, and Vdg of the transistor pair M41-M42, FIG. 4C shows voltage swings Vgs, Vds, and Vdg of the transistor pair M11-M12, and FIG. 4D shows voltage swings Vgs, Vds, and Vdg of the transistor pair M21-M22. The waveforms of gate-source voltage Vgs of each transistor of the transistor pairs M11-M12, M21-M22, M31-M32, and M41-M42 are labeled as 402. The waveforms of drain-source voltage Vds of each transistor of the transistor pairs M11-M12, M21-M22, M31-M32, and M41-M42 are labeled as 404. The waveforms of drain-gate voltage Vdg of each transistor of the transistor pairs M11-M12, M21-M22, M31-M32, and M41-M42 are labeled as 406.

As shown, Vgs 402, Vds 404, and Vdg 406 of each transistor of the transistor pairs M11-M12, M21-M22, M31-M32, and M41-M42 are approximately within the specified voltage range of +/−2.5 V with occasional larger voltage at some instances such as 410. A maximum of 20% over stress was observed in one example. However, compared to other power amplifier designs that may place much larger voltage swing, the operation voltage range across each transistor is reduced close to the specified voltage (e.g., +/−2.5 V) by using the gate capacitors Cg3 and Cg4. Thus, the stress of each transistor is reduced, thus the reliability issue from over stressing the transistors of the power amplifier 100 is mitigated.

Figure 5:
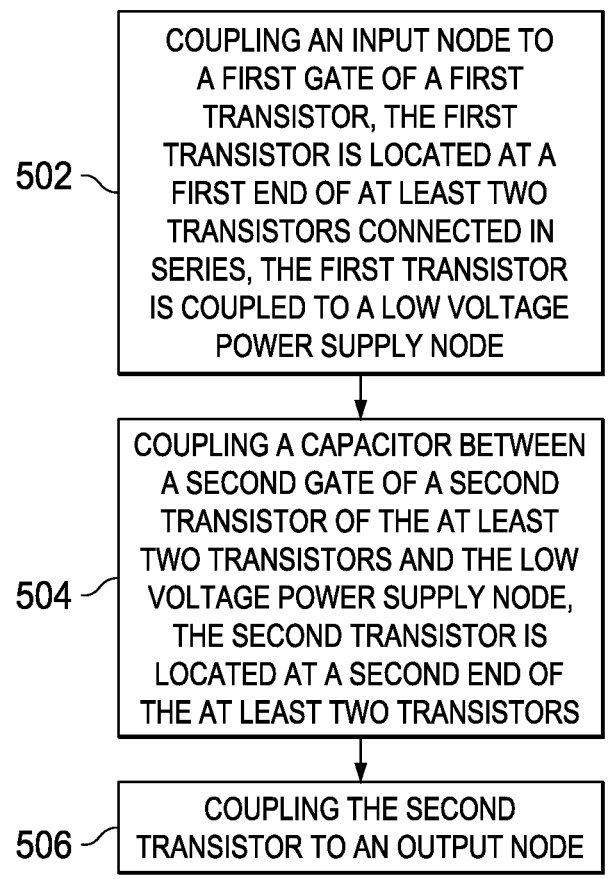
FIG. 5 is a flow diagram of a method for the power amplifier of FIG. 1 according to some embodiments.

FIG. 5 is a flow diagram of a method for the power amplifier 100 of FIG. 1 according to some embodiments. At step 502, an input node is coupled to a first gate of a first transistor such as M11. The first transistor is located at a first end of at least two transistors connected in series. The first transistor such as M11 is coupled to a low voltage power supply node (Vss or ground).

At step 504, a capacitor such as Cg4 is coupled between a second gate of a second transistor such as M41 of the at least two transistors and the low voltage power supply node (Vss or ground). The second transistor such as M41 is located at a second end of the at least two transistors.

At step 506, the second transistor such as M41 is coupled to an output node. As described above with respect to the power amplifier 100 in FIG. 1, additional devices such as M12, M21, M22, M31, M32, and M42, and additional components such as Cg3, R2, R3, and R4, are included in the power amplifier 100 according to some embodiments. Also, additional circuits such as the input circuit 102 and output circuit 104 are included in the power amplifier 100 according to some embodiments.

FIG. 6 illustrates another embodiment of a power amplifier 200 according to some embodiments. The power amplifier 200 is similar to the power amplifier 100. The input circuit 102 is configured to receive an input signal at the input node. In this example, the power amplifier 100 is arranged to receive an input signal at the input node and the input circuit 102 provides differential signals to the transistor pair of M11-M12 from the input signal. A capacitor Cin1 is coupled between the input node and a low voltage power supply node (Vss or ground). The capacitor Cin1 can be used to provide input impedance matching. For example, the input impedance can be designed to be 50 ohm. In some embodiments, the capacitor Cin1 has a capacitance value ranging from about 1 fF to about 100 pF. In one example, the capacitor Cin1 has a capacitance value of 0.46 pF.

One side of a transformer TFin is also coupled between the input node and a low voltage power supply node (Vss or ground) in parallel with the capacitor Cin1. The other side of the transformer TFin is coupled in parallel with another capacitor Cin2. The capacitor Cin2 is coupled in between the gates of the transistor pair M11-M12. In some embodiments, the transformer TFin has an inductance value ranging from about 1 pH to about 100 nH and a coupling coefficient of 0.01 to 1. In some embodiments, the capacitor Cin2 has a capacitance value ranging from about 1 fF to about 100 pF. In one example, the capacitor Cin2 has a capacitance value of 0.74 pF.

The transformer TFin and the capacitor Cin2 provides differential signals to the gates of the transistor pair M11-M12. A bias voltage Vg1 is coupled to the gate of the transistor pair M11-M12. The four transistor pairs M11-M12, M21-M22, M31-M32, and M41-M42 are NMOS transistors in some embodiments. The four transistor pairs M11-M12, M21-M22, M31-M32, and M41-M42 are connected in series. For example, the drains of the transistor pair M11-M12 is connected to the sources of the transistor pair M21-M22 respectively. The drains of the transistor pair M21-M22 is connected to the sources of the transistor pair M31-M32 respectively. The drains of the transistor pair M31-M32 is connected to the sources of the transistor pair M41-M42 respectively.

In addition to resistor pairs R3 and R4, capacitor pairs Cg3 and Cg4 of the power amplifier 100, another capacitor pair Cg2 is coupled to the gates of the transistor pair M21-M22. A resistor pair R2 is connected to the respective gate of the transistor pair M21-M22 and the bias voltage Vg2. In one example, the gate-source voltage Vgs of transistors of the transistor pairs is specified as 2.5 V and the drain-source voltage Vds of transistors of the transistor pairs is specified as 5 V.

Assuming the voltage swing of the input signal coupled to the gates of the transistor pair M11-M12 is 0 V-2.5 V, the voltage swing at the drains of the transistor pair M11-M12 is 0 V-5 V in one example. The voltage swing at the gates of the transistor pair M21-M22 is 2.5 V-5 V in one example, compared to 0 V-7.5 V if the capacitor pair Cg2 is not coupled to the gates of the transistor pair M21-M22. The voltage swing at the drains of the transistor pair M21-M22 is 0 V-10 V after two transistor pair stacking in series with M11-M12 and M21-M22 in one example.

The voltage swing at the gates of the transistor pair M31-M32 is 2.5 V-10 V in one example, compared to 0 V-12.5 V if the capacitor pair Cg3 is not coupled to the gates of the transistor pair M31-M32. The voltage swing at the drains of the transistor pair M31-M32 is 0 V-15 V after three transistor pair stacking in series with M11-M12, M21-M22, and M31-M32 in one example. The voltage swing at the gates of the transistor pair M41-M42 is 2.5 V-15 V, compared to 0 V-17.5 V if the capacitor pair Cg4 is not coupled to the gates of the transistor pair M41-M42. The voltage swing at the drains of the transistor pair M41-M42 is 0 V-20 V after four transistor pair stacking in series with M11-M12, M21-M22, M31-M32, and M41-M42 in one example.

By coupling gate capacitors Cg2, Cg3, and Cg4 to the gates of the transistor pairs M21-M22, M31-M32 and M41-M42, the operation voltage (e.g., Vgs, Vds, and/or Vdg) across transistors is reduced compared to not using the gate capacitors Cg2, Cg3, and Cg4. Thus, the stress of transistors is reduced and the power amplifier to mitigate the reliability issue from over stressing the transistors. In some embodiments, the capacitor Cg2, Cg3, or Cg4 has a capacitance value ranging from about 1 fF to about 100 pF. The values of each component, including gate capacitors Cg3 and Cg4 can be determined from simulation in some embodiments.

Figure 7:
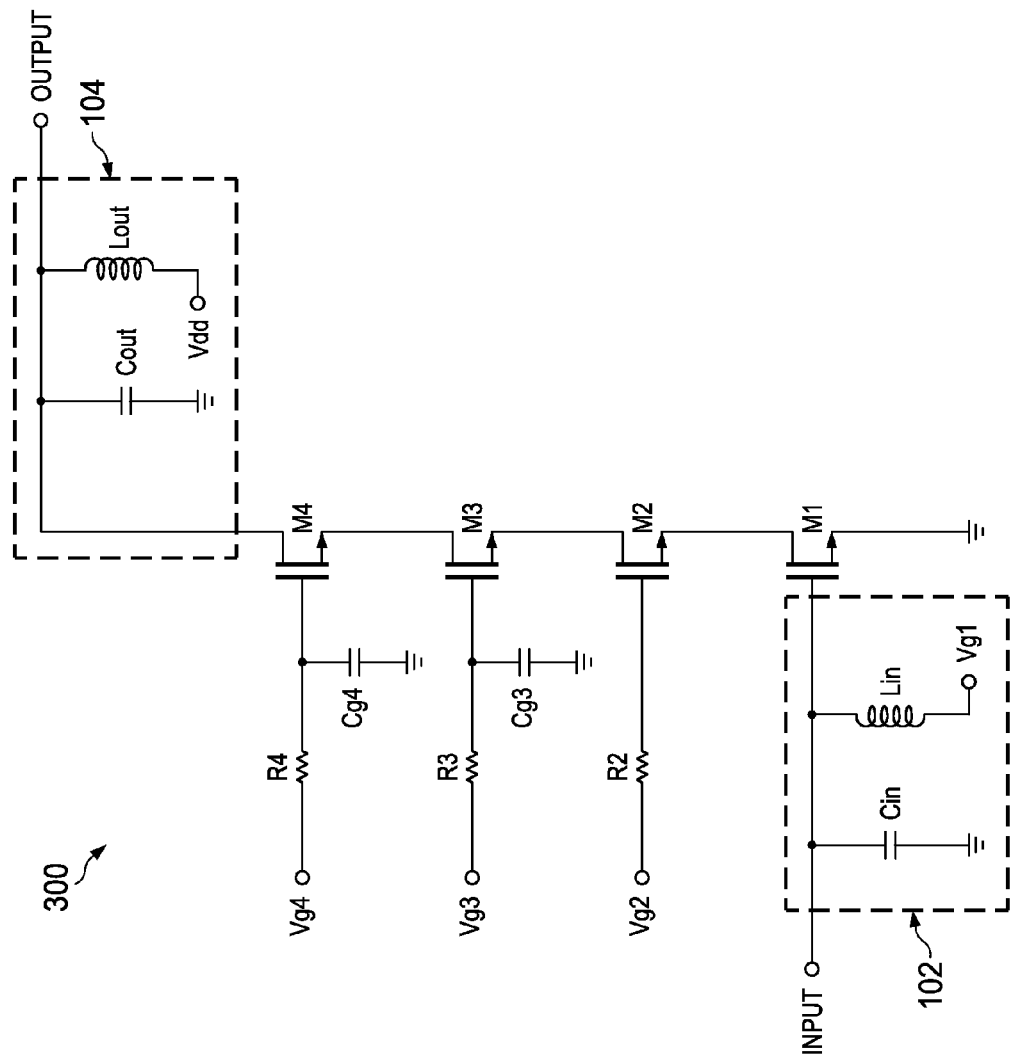
FIG. 7 illustrates yet another embodiment of a power amplifier according to some embodiments.

FIG. 7 illustrates yet another embodiment of a power amplifier 300 according to some embodiments. The power amplifier 300 is similar to the power amplifier 100 in FIG. 1 except that the power amplifier 300 has a single ended structure instead of a differential structure. For example, there is a single transistor M1 in FIG. 7 instead of the transistor pair M11-M12 in FIG. 1. There is a single transistor M2 in FIG. 7 instead of the transistor pair M21-M22 in FIG. 1. There is a single transistor M3 in FIG. 7 instead of the transistor pair M31-M32 in FIG. 1. There is a single transistor M4 in FIG. 7 instead of the transistor pair M41-M42 in FIG. 1.

Because the power amplifier 300 has a single ended structure, the input circuit 102 does not include the transformer TFin and capacitor Cin2 in the power amplifier 100. A capacitor Cin and an inductor Lin are used for impedance matching in some embodiments. In one example, the input impedance is matched to 50 ohm. The values of components are similar to the power amplifier 100 described above in some embodiments. The voltage swing values are also similar to the power amplifier 100 described above in some embodiments.

Figure 8:
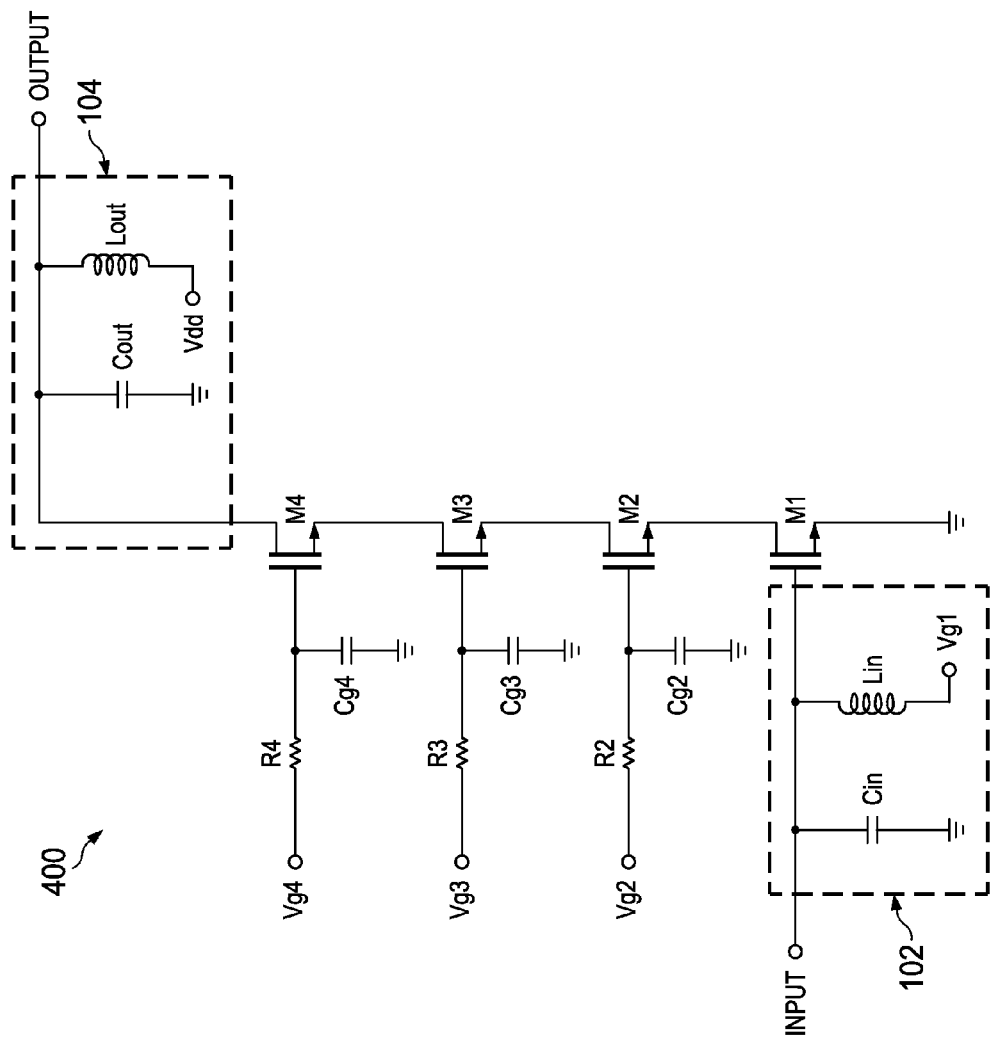
FIG. 8 illustrates yet another embodiment of a power amplifier according to some embodiments.

FIG. 8 illustrates yet another embodiment of a power amplifier 400 according to some embodiments. The power amplifier 400 is similar to the power amplifier 200 in FIG. 6 except that the power amplifier 300 has a single ended structure instead of a differential structure. For example, there is a single transistor M1 in FIG. 8 instead of the transistor pair M11-M12 in FIG. 6. There is a single transistor M2 in FIG. 8 instead of the transistor pair M21-M22 in FIG. 6. There is a single transistor M3 in FIG. 8 instead of the transistor pair M31-M32 in FIG. 6. There is a single transistor M4 in FIG. 8 instead of the transistor pair M41-M42 in FIG. 6.

Because the power amplifier 400 has a single ended structure, the input circuit 102 does not include the transformer TFin and capacitor Cin2 in the power amplifier 200. A capacitor Cin and an inductor Lin are used for impedance matching in some embodiments. In one example, the input impedance is matched to 50 ohm. The values of components are similar to the power amplifier 200 described above in some embodiments. The voltage swing values are also similar to the power amplifier 200 described above in some embodiments.

According to some embodiments, a power amplifier includes an input circuit configured to receive an input signal. At least two transistors connected in series. A first transistor of the at least two transistors is located at a first end of the at least two transistors. A second transistor of the at least two transistors is located at a second end of the at least two transistors. The first transistor is coupled to a low voltage power supply node. The first gate of the first transistor is coupled to a first bias voltage. The input signal is coupled to a first gate of the first transistor. At least one capacitor is coupled between a second gate of the second transistor and the low voltage power supply node. An output circuit coupled to a second gate of the second transistor.

According to some embodiments, a power amplifier includes an input circuit configured to receive an input signal. At least two transistor pairs are connected in series. A first transistor pair of the at least two transistor pairs is located at a first end of the at least two transistor pairs. A second transistor pair is located at a second end of the at least two transistor pairs. The first transistor pair is coupled to a low voltage power supply node. The first gates of the first transistor pair is coupled to a first bias voltage. The first gates of the first transistor pair are arranged to receive differential signals from the input circuit. A first capacitor pair is coupled between respective second gates of the second transistor pair and the low voltage power supply node. An output circuit is coupled to the second transistor pair and configured to provide an output signal.

According to some embodiments, a method includes coupling an input node to a first gate of a first transistor. The first transistor is located at a first end of at least two transistors connected in series. The first transistor is coupled to a low voltage power supply node. A capacitor is coupled between a second gate of a second transistor of the at least two transistors and the low voltage power supply node. The second transistor is located at a second end of the at least two transistors. The second transistor is coupled to an output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power amplifier, comprising:
an input circuit configured to receive an input signal;
at least three transistors connected in series, wherein a first transistor of the at least three transistors is located at a first end of the at least three transistors, a second transistor of the at least three transistors is located at a second end of the at least three transistors, a third transistor of the at least three transistors is connected in series between the first transistor and the second transistor, the first transistor is coupled to a low voltage power supply node, a first gate of the first transistor is coupled to a first bias voltage, and the input signal is coupled to the first gate of the first transistor;
at least one capacitor coupled between a second gate of the second transistor and the low voltage power supply node; and
an output circuit coupled to a drain of the second transistor;
wherein a second gate of the second transistor is connected to a second bias voltage through a resistive capacitive circuit and the gate of the third transistor is connected to a third bias voltage through a resistive only circuit.

2. The power amplifier of claim 1, further comprising a resistor coupled to a second bias voltage and the second gate of the second transistor, and the second bias voltage is greater than the first bias voltage.

3. The power amplifier of claim 1, further comprising a third transistor of the at least three transistors connected directly with the first transistor in series.

4. The power amplifier of claim 3, further comprising a first resistor coupled to a second bias voltage and the second gate of the second transistor, wherein the second bias voltage is greater than the first bias voltage; and
a second resistor coupled to a third bias voltage and the third gate of the third transistor, wherein the third bias voltage is greater than the first bias voltage.

5. The power amplifier of claim 3, further comprising a second capacitor coupled between the third gate of the third transistor and the low voltage power supply node.

6. The power amplifier of claim 3, further comprising a fourth transistor of the at least two transistors connected between the second transistor and the third transistor.

7. The power amplifier of claim 6, further comprising:
a second capacitor coupled between a fourth gate of the fourth transistor and the low voltage power supply node; and
a resistor coupled to a second bias voltage and the fourth gate of the fourth transistor, wherein the second bias voltage is greater than the first bias voltage.

8. The power amplifier of claim 1, wherein the first transistor is one transistor of a first transistor pair, and the second transistor is one transistor of a second transistor pair.

9. The power amplifier of claim 1, wherein a voltage at the first gate of the first transistor is independent of a voltage at the drain of the second transistor.

10. A power amplifier, comprising:
an input circuit configured to receive an input signal;
at least three transistor pairs connected in series, wherein a first transistor pair of the at least three transistor pairs is located at a first end of the at least three transistor pairs, a second transistor pair is located at a second end of the at least three transistor pairs, and a third transistor pair located between the first transistor pair and the second transistor pair, the first transistor pair is coupled to a low voltage power supply node, the first gates of the first transistor pair is coupled to a first bias voltage, and the first gates of the first transistor pair are arranged to receive differential signals from the input circuit;
a first capacitor pair coupled between respective second gates of the second transistor pair and the low voltage power supply node; and
an output circuit coupled to the second transistor pair and configured to provide an output signal, the second gates of the second transistor pair being biased to a second bias voltage by a resistive capacitive circuit;
third gates of the third transistor pair being biased to a third bias voltage by a resistive only circuit.

11. The power amplifier of claim 10, further comprising a resistor pair coupled to a second bias voltage and the second gates of the second transistor pair respectively.

12. The power amplifier of claim 10, wherein the second bias voltage is greater than the first bias voltage.

13. The power amplifier of claim 10, further comprising a third transistor pair of the at least three transistor pairs connected directly with the first transistor pair in series, wherein third gates of the third transistor pair are tied together.

14. The power amplifier of claim 13, further comprising a single resistor coupled to a second bias voltage and the second gates of the second transistor pair, wherein the second bias voltage is greater than the first bias voltage.

15. The power amplifier of claim 13, further comprising a resistor pair coupled to a second bias voltage and the third gates of the third transistor pair, wherein the second bias voltage is greater than the first bias voltage.

16. The power amplifier of claim 13, further comprising a second capacitor pair coupled between the respective third gates of the third transistor pair and the low voltage power supply node.

17. The power amplifier of claim 13, further comprising a fourth transistor pair of the at least two transistor pairs connected between the second transistor pair and the third transistor pair.

18. The power amplifier of claim 17, further comprising a second capacitor pair coupled between respective fourth gates of the fourth transistor pair and the low voltage power supply node.

19. The power amplifier of claim 17, further comprising a resistor pair coupled to a second bias voltage and the fourth gates of the fourth transistor pair respectively, wherein the second bias voltage is greater than the first bias voltage.

20. The power amplifier of claim 10, wherein the input circuit configured to provide the differential signals from the input signal.

21. The power amplifier of claim 10, wherein voltage at the first gates of the first transistor pair, the second gates of the second transistor pair, and the third gates of the third transistor pair are independent of the output signal.

* * * * *